United States Patent [19]

Dimyan

[11] 4,125,876
[45] Nov. 14, 1978

[54] FIELD ACCESS BUBBLE LATTICE FILE DEVICE

[75] Inventor: Magid Y. Dimyan, San Diego, Calif.

[73] Assignee: Burroughs Corporation, Detroit, Mich.

[21] Appl. No.: 764,230

[22] Filed: Jan. 31, 1977

[51] Int. Cl.² .............................................. G11C 19/08
[52] U.S. Cl. ............................................ 365/3; 365/8
[58] Field of Search ...................... 340/174 TF; 365/3

[56] References Cited

U.S. PATENT DOCUMENTS

| | | | |
|---|---|---|---|
| 3,927,398 | 12/1975 | Dimyan | 340/174 TF |
| 4,023,150 | 5/1977 | Voegeli | 340/174 TF |
| 4,028,685 | 6/1977 | Eggenberger et al. | 340/174 TF |
| 4,034,357 | 7/1977 | Mehta et al. | 340/174 TF |

OTHER PUBLICATIONS

Proceedings of the IEEE – Dec. 1973; pp. 1761–1762.

*Primary Examiner*—James W. Moffitt
*Attorney, Agent, or Firm*—Joseph R. Dwyer; Mervyn L. Young; Kevin R. Peterson

[57] ABSTRACT

A bubble lattice file comprising a plurality of propagate elements of magnetic film material positioned as an overlay over bubble supporting material with each element spaced from the bubble material such that a spacing gradient is formed between the element and the bubble material in the direction of the bubble propagation path. The elements comprising the main lattice memory file are arranged to support a hexagonal lattice of bubbles with one bubble propagation path in the form of rows and the other propagation path comprising accessing channels in the form of spaced apart columns. Utilizing the translation force on a bubble domain produced by the spacing gradient between the magnetic film and the bubble material, all bubbles in the lattice may be translated along the rows by a monopolar magnetic field applied in the row direction and when accessing is required, a monopolar field in the column direction is applied and all bubbles in equilibrium in the element of the rows which intersect the columns will move to the elements of the accessing channels and along its elements upon the continued application of the field ultimately exiting into a reading station. Concurrently, the read data may be reentered into the lattice at the entrance end of the columns.

6 Claims, 3 Drawing Figures

FIELD ACCESS BUBBLE LATTICE FILE DEVICE

BACKGROUND OF THE INVENTION

This invention relates, in general, to bubble memories and, in particular, to lattice file bubble memory techniques.

Reference is made to in the article by Cohen and Chang, Proceedings of "IEEE" Volume 63, Number 8, August, 1975, entitled, "The Frontiers of Magnetic Bubble Technology", as an example of the existing state of the art in lattice file memories. In this article, the authors discuss the improvement in the packing density in bubble lattice file configurations over existing bubble memories of the non-lattice file type utilizing a stable two-dimensional hexagonal closely-packed array of bubbles created in a bubble film and maintained under bias fields leading to states intermediate between stripout and collapse conditions. The bubble diameter and lattice spacing are determined by the applied bias field, the bubble-bubble interactions and magnetic constants of the bubble film.

As desribed in the article, the coding scheme in bubble lattice files makes use of different kinds of domain walls which separate the two states of oppositely directed magnetization inside and outside the bubble. The two simple structures are the "$S = 1$" state and the "$S = 0$" state; the latter having opposing senses of magnetization associated with the two halves of the wall separated by vertical boundaries known as "Bloch lines" to distinquish the latter from the $S = 1$ state which has no "Bloch lines". Since the bubbles associated with both states are magnetostatically identical, digital 1's and 0's are arbitrarily identified as, for example, "1" is $S = 1$ and "0" is $S = 0$ of the appropriate lattice sites. The article then goes on to describe a device for detecting the state of reading, writing and accessing the bubbles in the lattice.

In the prior art device described in the Cohen et al article, the bubble lattice is bounded at the top and bottom by horizontal barriers formed by making the bubble film thicker in the region outside the lattice or active area so that magnetostatic forces keep the bubbles within these barriers. Buffer regions on the right and left sides of the lattice area are formed by extra columns of "dummy" bubbles or by horizontal strippedout domains. Data is accessed by translating the entire lattice horizontally along the rows of the lattice so that various columns of bubbles are brought at will into coincidence with the access channels. These access channels, as well as the buffer regions, are canted in accordance with the symmetry of the hexagonal array. Reading and writing is then carried out by moving the column of bubbles along an access channel to an appropriate write or read station. In order to move the bubbles along the array, pairs of conductors connected in series are spaced periodically along the array and an appropriate bipolar excitation pulses of these pairs generate the perpendicular field gradients.

For reading the data, the state of the bubble is detected by utilizing the fact that in a gradient field $S = 0$ bubbles travel along the gradient, while $S = 1$ bubbles move with a velocity component normal to the gradient, thus, two categories of bubbles may be moved in different channels and their presence or absence is sensed magnetoresistively.

The writing operation is performed by pulsing a conductor line so that a local transient in the perpendicular bias field is created. The local bias field transient causes the generation of a $S = 1$ state in the absence of a substantial in-plain field while an $S = 0$ state is created in its presence.

Some of the disadvantages and problems with this prior art bubble lattice file device as stated in the above article is that the processing of the bubble lattice file requires many masking levels. This is confirmed in the article by Voegeli, Calhoun, Rosier, and Slonczewski, entitled, "The Use of Bubble Lattices for Information Storage" AIP Conference Proceedings (USA) No. 24, pages 617–19 in 1974 at the 20th Annual Conference on Magnetism and Magnetic Materials, Dec. 3-6, 1974.

One of the reasons for the many masking levels is to provide the thicker bubble material in the region outside the lattice or active area as mentioned above. Also since the prior device is working directly with the bubble material, i.e., not using an overlay pattern, and since the lattices are somewhat difficult to control, it is necessary to groove the material longitudinally to retain the lattices which grooving also requires another masking level.

Another disadvantage in the prior art is the manufacture of the current carrying conductors which makes the device processing tedious and difficult thus reducing the total yield.

In connection with these current carrying conductors, another disadvantage is that since these conductors are directly on the bubble material, the generation of heat by the pulsing of these conductors is a significant problem in this prior art.

Accordingly, it is one object to this invention to provide a bubble lattice file which eliminates the complexities in the manufacture of the prior art devices.

It is still another object to this invention to provide a bubble lattice file which eliminates a number of masks in the process of manufacture of the lattice. Finally, it is a primary object of this invention to provide a bubble lattice file which eliminate altogether the current carrying conductors by utilizing unipolar magnetic fields to propagate and access the memory.

In connection with the foregoing objects and having recognized the disadvantages of the prior art as aforesaid, and turning to the prior art in other bubble memories of the non-lattice type, it should be pointed out that in the U.S. Pat. No. 3,927,398 issued to Magid Y. Dimyan on Dec. 16, 1975 and entitled, "Magnetic Bubble Propagation Circuit" it was shown that a translation force acting on magnetic bubble domains can also be produced by means of a gradient in the spacing between bubble material and the propagate element. As described in this patent an overlay of propagation elements of uniform thickness of material were spaced from a film of bubble material with one end of the element having a greater spacing than the other so as to form a gradient between the bubble material and the ends of each element in the direction of propagation. With this pattern, a periodic monopolar magnetic field applied in the plane of the bubble material and parallel to the propagation path, magnetize the element causing the bubbles to move from one element to an adjacent element across the gap between the element. When the elements were demagnetized, that is, when the magnetic field ceased (being periodic), the bubble moved from the high end of the element to the lower end. Thus, the spacing gradient itself was relied upon to move the bubbles in the absence of an unapplied magnetic field.

This invention takes the teachings of this patent forward and applies the teachings of this invention even though from a non-lattice type memory and utilizes the principle to form the lattice file including the rows as well as the accessing channels or columns thus constituting a considerable improvement both over the teachings of the prior art in connection with bubble lattice files aforesaid.

SUMMARY OF THE INVENTION

The invention which overcomes the deficiencies and disadvantages of the prior art and fulfills all the objects aforesaid, comprises, bubble lattice file device having a plurality of propagate elements formed in a film of magnetic material positioned over bubble supporting material with each propagate element spaced from the bubble material such that a spacing gradient is formed between the bar and the bubble material in the direction of the bubble propagation path. The propagate elements are arranged to support a hexagonal array of bubbles with the main lattice memory file, i.e., in rows, one bubble propagation path comprising rows and the other propagation path comprising accessing channels in the form of spaced apart columns which are canted from the rows at an angle corresponding to the symmetry of the hexagonal array of bubbles forming the lattice. Utilizing the translational force on a bubble domain produced by the spacing gradient between the magnetic film and the bubble material, all bubbles in the lattice may be translated along the rows by a monopolar field applied in the row direction. When accessing is required, a monopolar field in the direction of the column is applied and all bubbles located in equilibrium position in the propagate elements of these rows will move to the propagate elements of the accessing channels and along this its propagate element exiting into a detection for reading. Concurrently, the read data may be reentered into the entrance of these columns for storage in the lattice.

The foregoing bubble lattice file device utilizing the spacing gradient with the magnetic film overlay stablilizes the hexagonal lattice and eliminates the need for the grooves in the bubble supporting material thus eliminating this masking step needed to form such grooves and is eliminated the horizontal barriers of the prior art device thus eliminating the masking steps necessary to make the bubble material thicker in the region outside the lattice area and at the same time has reduced the width of the buffer area since it is now needed only to stabilize the adjacent columns of the lattice during accessing, but perhaps most important of all, has eliminated the conductors for translating the lattice bubbles in the active lattice area with the attendant masking and heating problems by utilizing magnetic fields to accomplish this translation as well as accessing the bubbles.

Other additional objects and advantages of this invention will become apparent to those skilled in the art from the following description of the preferred embodiment and the drawings wherein.

BRIEF DESCRIPTION OF THE PREFERRED EMBODIMENT

Figure 1:
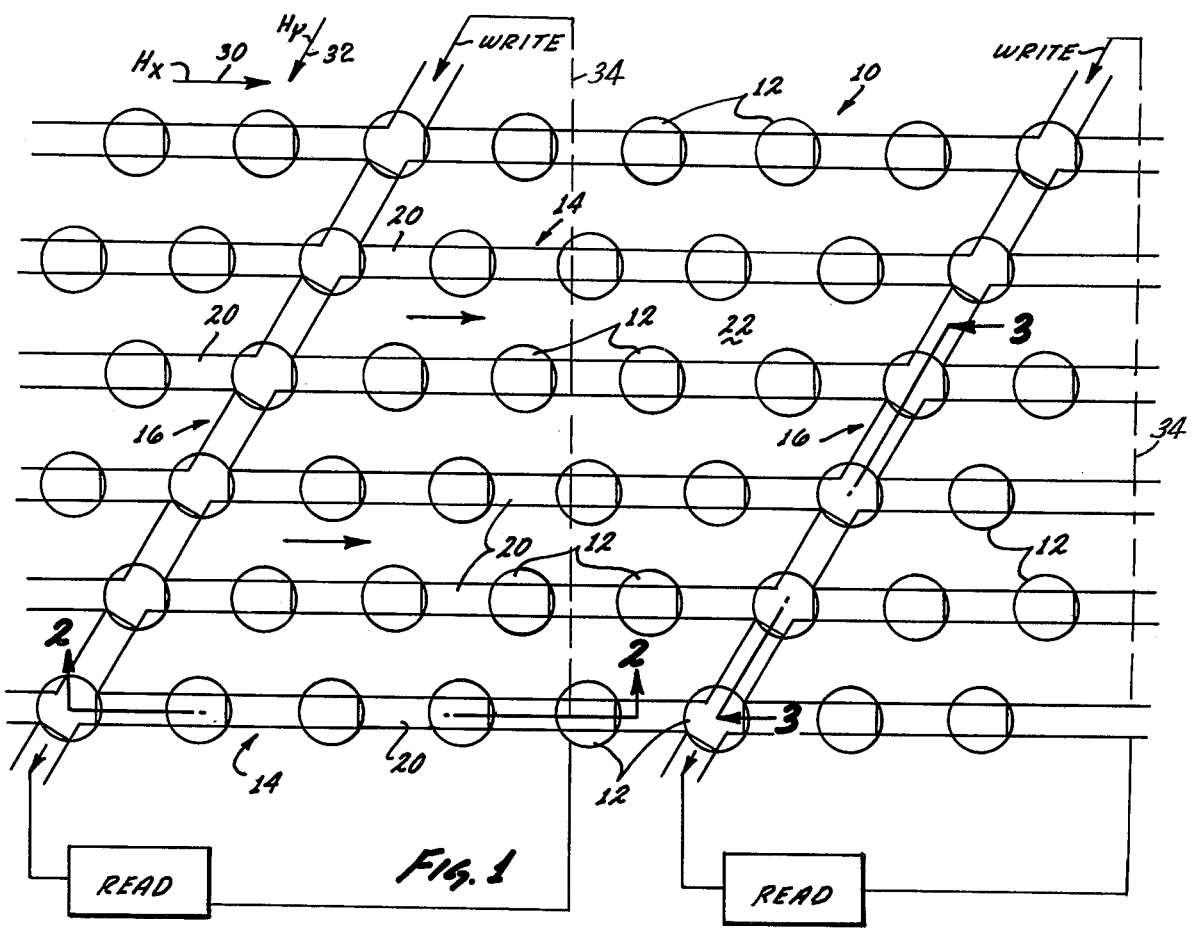
FIG. 1 is a schematic illustration of a bubble lattice file constructed in accordance with a teaching of this invention.

In the drawings there is disclosed a bubble lattice file, indicated in its entirety as 10 and constructed in accordance with the teachings of this invention but only shown as a portion of a larger memory for the sake of clarity in describing the embodiment.

The bubble lattice file 10 comprises a lattice of bubbles 12 conventionally hexagonally oriented and closely packed to define bit positions so that information is stored by having the lattice composed of two kinds of bubbles. Conventionally, among the many possible wall states of the bubble is the use of states $S = 0$ as representing a digital "0" and $S = 1$ representing digital "1" depending on whether or not the wall magnetization has "Bloch lines" or not as described supra. The two states can be reliably discriminated by their different deflection angles in a field gradient.

To maintain the bubble lattice and to access the domains for discrimination or detection so as to determine the data stored, the device generally comprises rows 14 on which the bubbles are supported and translated and access channels 16 spaced apart a pre-determined amount largely dependent upon the data bit or byte system in which the lattice file device is to be used. Thus, while in the embodiment shown only 6 rows are utilized with the columns spaced apart 6 domains, any number can be utilized.

Figure 2:
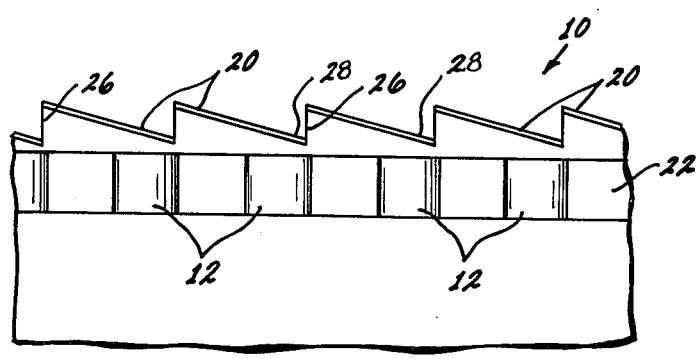
FIG. 2 is a cross-sectional view taken along line 2—2 of FIG. 1 schematically illustrating the the propagation circuit the rows.
Figure 3:
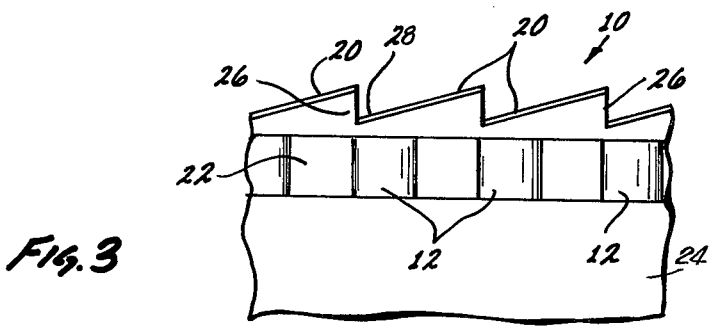
FIG. 3 is a cross-sectional view taken along line 3—3 of FIG. 2 and illustrating the accessing channels of columns of propagate elements constructed in accordance with the teachings of this invention.

Now more specifically to the device which supports and translates the bubble lattice, it is to be noted that each row comprises a plurality of propagate elements in the form of bars 20 formed of Permalloy or similar magnetic material by a photolithographic process and spaced from an epitaxial film 22 (for example, LPE epitaxy magnetic film) on a non-magnetic substrate 24 such as Gadolinium Gallium Garnet. Each element 20 in the row is preferrably the same length and preferrably identical to obtain the maximum number of storage points in the pattern and, as clearly shown in FIG. 2, the spacing 26 between one end of each element 20 and the epitaxial material 22 is greater than the spacing 28 of the other end of the element from this same material to form a slope or gradient. This gradient is maintained as well as all other gradients under all of the elements by a wedge-shaped non-magnetic element of material such as silicon dioxide. The function of the spacing gradient is more specifically described in detail in the aforesaid Dimyan patent. Similar to the rows 14, the access channels 16 are also made up propagate elements in the form of bars 20 also formed with a spacing gradient by the silicon dioxide material over the magnetic bubble material but the propagation path is in a direction according to the lattice configuration as herein before stated.

In operation, a magnetic field producing structure provides an unipolar pulsed or sinusoidal propagating field in the direction of the propagation path of the lattice shown by the arrow 30, i.e., in the direction of the rows. Because of the gradient in each of the bars, a bubble will be at equilibrium at the lowest end of the bar, that is, the end of the bar closest to the bubble material 22 in the absence of an inplane drive field. When a magnetic field is applied in the direction of the arrow, the bubble will move forward in this same direction to a position under the end of the adjacent bar, that is, under the end of the bar spaced the furthest from the bubble material 22. However, when the propagating field is reduced to zero, the gradient in the spacing between the bar 20 and the film will create a translation force on the bubble which will push the bubble towards the lower end of the same bar. Thus, a uni-directional or unipolar field is all that is required to move a bubble domain one propagation cycle. The pulse width or the field on-time must be sufficiently long to allow the bubble to move across the distance between adjacent bars and the field off time must be sufficiently long to allow the bubble to move from end, i.e., the high end to the lower end of the bar.

Utilizing this same principle, a sinsoidal or unipolar field in the direction of the arrow 32, i.e., parallel to the access channels will operate to translate the bubbles at equilibrium or rest in the lower end of the bars in the rows to the high end of the bars in the columns and again, secession of the field will allow the gradient to operate on the bubbles and move them to the lower end of the bar their point of equilibrium. The number of pulses of the uni-directional field or sinsoidal field will depend on the number of rows to be accessed. The exit of the bubbles from the access channels place them into a detector where they can be detected in accordance with known detection methods.

Concurrently, therewith this detected bubble may be entered at the top of the column as a rewrite function into the lattice memory, if desired as shown by way of example by conductor lines 34 from the read section to the write section.

What is claimed is:

1. A bubble lattice file device for storing data by placing an array of bubble domains of different states in a lattice at the appropriate lattice sites comprising:
    an overlay of propagate elements of magnetic material positioned over a film of magnetic bubble material said propagate elements defining rows for the propagation of bubbles there along,
    means adapted to space the propagate elements from the bubble material to maintain a uniform gradient between each of said propagate element and the bubble material in the direction of translation of the bubbles,
    an overlay of propagate elements of magnetic material positioned over the film of magnetic bubble material defining access channels spaced at intervals between said bars defining said rows; and
    means for generating periodic magnetic fields in the plane of the bubble material and parallel to said rows and said access channels and capable of magnetizing said propagate element at the appropriate timing intervals.

2. The bubble lattice file as claimed in claim 1 wherein the periodic magnetic field has a form of a uni-directional and/or unipolar pulse and is directed periodically along the rows and periodically along the access channels.

3. The bubble lattice file as claimed in claim 2 wherein said gradient maintaining means comprises wedge-shaped non-matellic elements located between each of said propagate element and said bubble material.

4. The bubble lattice file as claimed in claim 3 wherein said propagate elements are bars which are rectangular with the length of the bar positioned in the direction of the rows and the bars of said access channels being positioned in the direction of columns.

5. The bubble lattice file as claimed in claim 4 wherein the bars of said access channels are positioned according to the orientation of the bubble lattice.

6. The bubble lattice file as claimed in claim 5 wherein said data detected at a read station may be reinserted at the write station at the beginning of said columns.

* * * * *